(12) United States Patent
Horie et al.

(10) Patent No.: US 6,633,477 B1
(45) Date of Patent: Oct. 14, 2003

(54) CONDUCTIVE MEMBER

(75) Inventors: Kenichi Horie, Machida (JP); Hiroyuki Ishida, Yokohama (JP)

(73) Assignee: Koninklijke Philips Electronics N. V., Eindhoven (NL)

( * ) Notice: Subject to any disclaimer, the term of this patent is extended or adjusted under 35 U.S.C. 154(b) by 208 days.

(21) Appl. No.: 09/787,971

(22) PCT Filed: Jul. 21, 2000

(86) PCT No.: PCT/EP00/07109

§ 371 (c)(1),
(2), (4) Date: Mar. 23, 2001

(87) PCT Pub. No.: WO01/08304

PCT Pub. Date: Feb. 1, 2001

(51) Int. Cl.[7] .................................................. H02H 1/00
(52) U.S. Cl. ...................................... 361/119; 333/211
(58) Field of Search ................................ 361/110, 111, 361/113, 119, 818; 333/204, 211, 238, 12, 246; 428/620, 624, 638, 640, 656; 174/36

(56) References Cited

U.S. PATENT DOCUMENTS

| | | | |
|---|---|---|---|
| 4,522,890 A | * 6/1985 | Volkers et al. | 428/624 |
| 4,559,281 A | * 12/1985 | Derfler et al. | 428/687 |
| 4,853,660 A | * 8/1989 | Schloemann | 333/204 |
| 4,880,599 A | * 11/1989 | Charles et al. | 419/6 |
| 5,847,628 A | * 12/1998 | Uchikoba et al. | 333/204 |

* cited by examiner

*Primary Examiner*—Ronald W. Leja
(74) *Attorney, Agent, or Firm*—Steven R. Biren

(57) ABSTRACT

The object of the invention is to provide a conductive member capable of attenuating the noise having frequency components, for example, of the order of several GHz efficiently. Signal line 21 is formed by using the first conductive paste containing a silver powder, a ferrite powder, an organic binder, a dispersant, and a solvent.

8 Claims, 2 Drawing Sheets

CONDUCTIVE MEMBER

BACKGROUND OF THE INVENTION

The invention relates to a conductive member having a first and a second material.

Hitherto, for example a FTC (Feed Through Capacitor) is used in order to eliminate a high frequency noise mixed into an electronic circuit.

When signal is inputted in FTC described above, DC and low frequency components of the input signal can hardly be attenuated, while a high frequency component of the input signals is attenuated greatly. However, this FTC shows the frequency characteristic that although the amount of attenuation of the signal is increased as the frequency of the input signal becomes high, in contrast with this, now, the amount of the attenuation is decreased when the frequency of the input signal increases. Thus, even though showing the characteristic that the amount of the attenuation is decreased, the high frequency noise can be eliminated by FTC when the frequency is not extremely high. However, in recent years, it has been required to attenuate the noise of the order of several GHz efficiently because of the increase of the clock frequency of the electronic equipment such as PC (personal computer), whereby it is hard to attenuate the noise of the order of several GHz or more efficiently by FTC described above.

BRIEF SUMMARY OF THE INVENTION

The object of the invention is to provide a conductive member capable of attenuating the noise having frequency components, for example, of the order of several GHz efficiently.

To achieve the above-mentioned object, the conductive member according to the present invention has a first material and a second material, characterized in that the product of conductivity and permeability of the conductive member is larger than the product of conductivity and permeability of a conductive member having only one of both the first and second materials.

The higher the frequency of current flowing in the conductive member (e.g. the conductive wire) becomes, the more the tendency of concentrating the current on the surface side of the conductive member accelerates by a skin effect. The a skin depth δ expressing the depth of the surface portion of the conductive member on which a current concentrates can be defined as the expression described below.

$$\delta = \sqrt{\frac{2}{\omega \sigma \mu}} \quad \text{[Expression 1]}$$

where, ω is an angular frequency, σ is conductivity and μ is permeability.

The product σμ of conductivity σ and permeability μ of the conductive member according to the present invention is larger than the product σμ of conductivity μ and permeability μ of a conductive member (hereinafter, in some cases, referred to as the conductive member for comparison) having only one of both the first and second materials.

For example if silver is provided as the described-above first substance and ferrite is provided as the described-above second substance, and the conductive member has silver, as well as ferrite is provided as the conductive member. In this case, the conductive member according to the invention would have both substances of silver and ferrite. Namely, the conductive member for comparison does not have ferrite which has large permeability, on the other hand, the conductive member according to the invention has ferrite which has large permeability. Therefore, when the product σμ of conductivity σ and magnetic permeability μ of this conductive member for comparison is defined as σμ1, on the other hand, the product σμ of the conductive member according to the invention is defined as σμ2, the skin depth δ of the conductive member according to the invention can be smaller than the skin depth δ of the conductive member for comparison by selecting the amount of ferrite contained in the conductive member according to the invention in such a way that σμ2 becomes larger than σμ1. Therefore, when the noise of the same frequency is fed into each of the conductive members according to the invention and the conductive member for comparison, the skin depth δ at the frequency of the noise of the conductive member according to the invention becomes smaller than that of the conductive member for comparison. Accordingly, the high frequency noise can be attenuated efficiently by using the conductive member according to the invention.

Moreover, considering simply from Expression 1, in order to make the skin depth δ small by increasing the product of conductivity and permeability, either the conductivity or the permeability can be increased. However, in the case of making the skin depth δ small by increasing the conductivity, the high frequency noise is more accepted by the high conductivity than the small skin depth δ. According to the invention, it is effective for attenuating the high frequency noise to make the skin depth δ small by increasing permeability without increasing the conductivity excessively. However, the low frequency signal which should not be accepted is attenuated when setting the conductivity excessively small. Therefore, the conductivity should be set on the basis of usage of the conductive member.

Preferably, according to the conductive member of the present invention, the first material is a metal and the second material is a magnetic material, and the product of conductivity and permeability of a conductive member having the metal and the magnetic material is larger than the product of conductivity and permeability of a conductive member not having the magnetic material but having the metal.

The conductive member according to the invention comprises magnetic materials, whereby the product of the conductivity and permeability of the conductive member according to the invention can be made large efficiently. That is to say, the skin depth can be made small efficiently.

Preferably, according to the conductive member of the present invention, the magnetic material is a ferromagnetic material.

The product of the conductivity and magnetic permeability can be made large further efficiently by using ferromagnetic material.

DETAILED DESCRIPTION OF THE INVENTION

Hereinafter the Invention will be described based on the following Figures.

Figure 1:
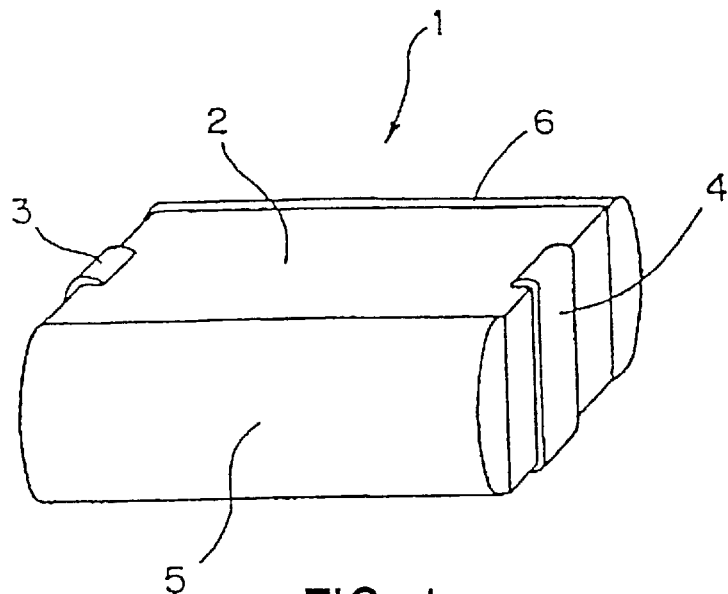
FIG. 1 is a perspective view of EMI filter with a signal line which is one mode of embodiment of the conductive member according to the invention.

FIG. 1 is a perspective view of EMI filter with a signal line (refer to FIG. 2 which will be described later) which is one mode for carrying out the conductive member according to the invention.

EMI filter 1 is provided with a rectangular parallelepiped-shaped ceramics basic body 2 consisting mainly of ceramics. Input external electrode 3 and output external electrode 4 are formed on central portions of the right and left side surface of this ceramics body 2. Moreover, ground external electrodes 5 and 6 are formed on the front and back side surface of the ceramics basic body 2.

Figure 2:
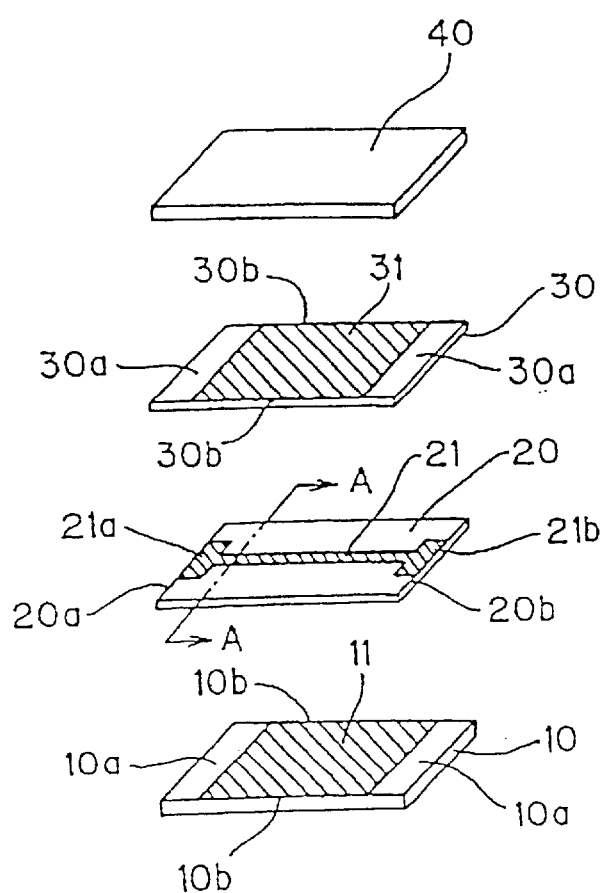
FIG. 2 is an exploded perspective view showing the ceramics basic body of the EMI filter shown in FIG. 1, the body being divided into four layers.

FIG. 2 is an exploded perspective view showing the ceramics basic body of the EMI filter shown in FIG. 1, the body being divided into four layers.

Each of four pieces of ceramics layers 10, 20, 30 and 40 is constituted by laminating a plurality of ceramics sheets which are consisting mainly of ceramics.

A square-shape ground electrode 11 is formed on a surface of a lowermost ceramics layer 10 of these four pieces of ceramics layers 10, 20, 30 and 40. This ground electrode 11 entirely covers the surface of the ceramics layer 10 except for two marginal portions 10a extending with predetermined widths along short sides of the surface of the ceramics layer 10, and the ground electrode 11 contact with the long side 10b of the surface of the ceramics layer 10.

A signal line 21 is formed on the surface of the ceramics layer 20 laminated directly above the ceramics layer 10 in such a way that the signal line 21 crosses the surface of the ceramics layer 10. Each of end portions 21a and 21b of the signal line 21 is formed in such a way that each of the end portions 21a and 21b contact with each of the short sides 20a and 20b of the surface of the ceramics layer 20.

Figure 3:
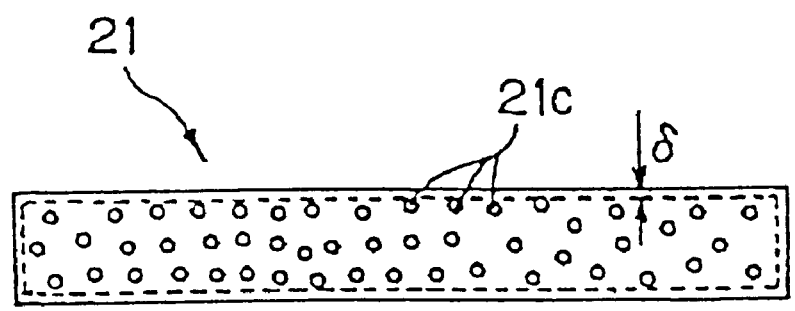
FIG. 3 is a sectional view of the signal line along line A—A of the ceramics layer 20 shown in FIG. 2.

FIG. 3 is a sectional view of the signal line along line A—A of the ceramics layer 20 shown in FIG. 2.

The signal line 21 consists mainly of silver, a ferrite powder 21c is interspersed inside the signal line 21.

Returning to FIG. 2, the description will be continued.

A ground electrode 31 which is of identical shape with the ground electrode 11 formed on the surface of the lowermost ceramics layer 10 is formed on the surface of the ceramics layer 30 laminated directly above the ceramics layer 20. This ground electrode 31 entirely covers the surface of the ceramics layer 30 except for two marginal portions 30a extending with predetermined widths along short sides of the surface of the ceramics layer 30, and the ground electrode 31 contact with the long side 30b of the surface of the ceramics layer 30. Furthermore, the ceramics layer 40 of a uppermost layer is formed directly above the ceramics layer 30.

The ceramics basic body 2 (refer to FIG. 1) is constituted by laminating the ceramics layer 10, 20, 30 and 40.

Since each of the end portions 21a and 21b of the signal line 21 formed on the surface of the ceramics layer 20 shown in FIG. 2 contacts with each of the short sides 20a and 20b of the surface of the ceramics layer 20, the input external electrode 3 and the output external electrode 4 shown in FIG. 1 is connected to the end portions 21a and 21b of the signal line 21 respectively. Moreover, since each of the ground electrodes 11 and 31 formed on each of the ceramics layers 10 and 30 contacts with each of the long sides 10b and 10b of the surface of the ceramics layers 10 and 30, the ground external electrodes 5 and 6 are connected to the both ground electrodes 11 and 31.

Hereinafter, a method of manufacturing EMI filter 1 constituted in such manner will be described with reference to FIG. 1 to FIG. 3. Moreover, for the sake of convenience, the method of manufacturing a piece of EMI filter 1 will be described. However, a plurality of EMI filters can be manufactured at same time by applying the method described below.

First, a dielectric paste consisting mainly of ceramics, a first conductive paste containing ferrite, and a second conductive paste containing no ferrite are prepared, furthermore a plural pieces of PET film are prepared. The first conductive paste containing ferrite is manufactured by mixing silver powder, the ferrite powder, an organic binder, a dispersant, and a solvent, on the one hand, the second conductive paste is made of raw materials except for the ferrite powder from the raw materials of the first conductive paste. For example, a powdery substance of Ni—Cu—Zn ferrite or the like is used as the ferrite powder described above.

After preparing three kinds of pastes and plural pieces of PET film described above, ceramics sheet is formed by applying the dielectric paste to each of PET films.

Subsequently, the dielectric paste is printed on the ceramics sheet formed on the separate PET film in accordance with the pattern of each of the ground electrodes 11 and 31 and the signal line 21. According to this operation, the ceramics sheet on which the ground electrode 11 is formed, the ceramics sheet on which the ground electrode 31 is formed, and the ceramics sheet on which the signal line 21 is formed are produced. In this case, the ground electrodes 11 and 31 are formed with the second conductive paste, on the one hand, the signal line 21 is formed with the first conductive paste.

After forming the signal line 21, the ground electrodes 11 and 31 on the separate ceramics sheet in the manner as described above, the ceramics sheet is peeled off from each PET film. Moreover, the ceramics sheets where no conductive paste is formed are also peeled off from each PET film in advance.

Thereafter, a stacked element of the ceramics sheet is constituted by stacking the ceramics sheet where the ground electrodes 11 is formed, the ceramics sheet where the signal line 21 is formed, the ceramics sheet where the ground electrodes 31 is formed, and a plural pieces of the ceramics sheet where no conductive paste is formed. Laminating the stacked element by heat and pressure will produce the ceramics basic body 2 (refer to FIG. 1). After forming the ceramics basic body 2 in the manner as described above, the ceramics basic body 2 is sintered. Next, the input external electrode 3, the output external electrode 4 and the ground external electrodes 5 and 6 are formed on the external surface of that ceramics basic body 2. As described above, EMI filter 1 shown in FIG. 1 is manufactured.

Figure 4:
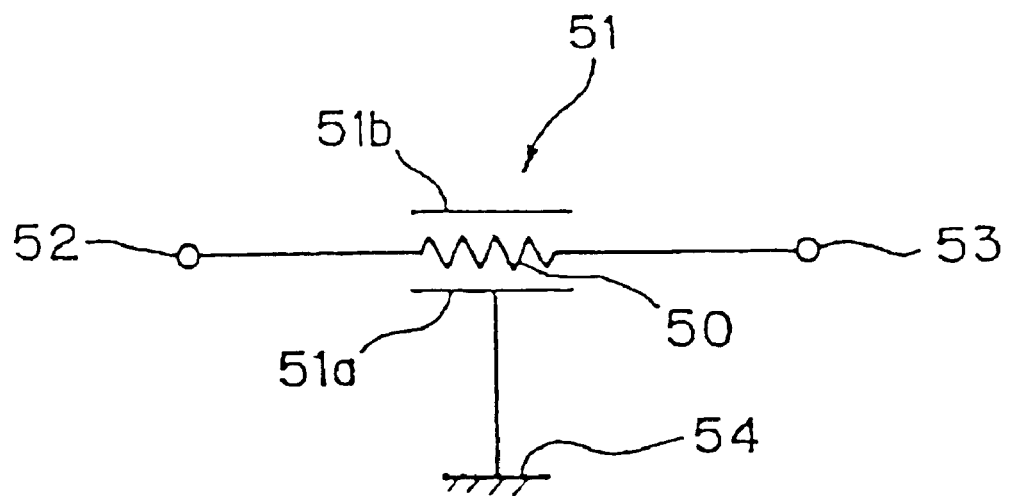
FIG. 4 is an equivalent circuit of EMI filter 1.

FIG. 4 is an equivalent circuit of EMI filter 1.

The equivalent circuit of EMI filter 1 is represented by a resistor 50 and a capacitor 51. The resistor 50 is formed by the signal line 21 (refer to FIG. 2), and the resistance of the resistor 50 depends upon the frequency of the current flowing in the resistor 50 (this reason will be described later). The capacitor 51 is formed by electrodes 51a and 51b corresponding to the ground electrodes 11 and 31 (refer to FIG. 2). The resistor 50 is positioned between these two pieces of electrodes 51a and 51b. The resistor 50 is connected to a terminal 52 corresponding to the input external electrode 3 (refer to FIG. 1) and a terminal 53 corresponding to the output external electrode 4, on the one hand, the capacitor 51 is connected to a ground terminal 54 corresponding to the ground external electrodes 5 and 6 (refer to FIG. 2). Although the major portion of low frequency signals does not flow into the capacitor 51, but passes through the signal line 21 forming the resistor 50, the major portion of the high frequency noise flows into the ground terminal 54 by way of the capacitor 51.

EMI filter 1 represented as the equivalent circuit contains the ferrite powder in the inside of the signal line 21 as shown in FIG. 3. If supposing that, in the case that the signal line 21 does not contain the ferrite powder, the permeability of this signal line 21 which does not contain the ferrite powder is defined as $\mu1$, and the conductivity as $\sigma1$, the skin depth $\delta$ (refer to FIG. 3) of this signal line 21 which does not contain the ferrite powder becomes $$\delta = \sqrt{\frac{2}{\omega \sigma 1 \mu 1}} \qquad \text{[Expression 2]}$$

from Expression 1.

In contrast with this, according to the embodiment of the present invention, the signal line 21 contains the ferrite powder 21c as shown in FIG. 3. Here, in the embodiment of the present invention, the permeability of this signal line 21 is defined as $\mu2$, and the conductivity of the signal line 21 as $\sigma2$. In the embodiment according to the invention, content of the ferrite powder 21c of the signal line 21 is adjusted in such a way that the conductivity $\sigma2$ of the signal line 21 itself does not become extremely smaller than the conductivity $\sigma1$ of the signal line which does not contain the ferrite powder, but can be retained in the approximately same value. Moreover, since the ferrite powder displays ferromagnetism, the permeability $\mu2$ of this signal line 21 becomes larger than the permeability $\mu1$ of the signal line which does not contain the ferrite powder. That is to say, the conductivity $\sigma2$ of the signal line 21 is retained at the approximately same value as the conductivity $\sigma1$ of the signal line which does not contain the ferrite powder, and the permeability $\mu2$ of this signal line 21 becomes larger than the permeability $\mu1$ of the signal line which does not contain the ferrite powder. Therefore, in this embodiment, the skin depth $\delta$ can be made smaller than the skin depth $\delta$ of the signal line which does not contain the ferrite powder. Therefore, in EMI filter 1 of this embodiment, the sectional area, where the high frequency component concentrating on the surface of the signal line by means of the skin effect passes, further becomes small as compared with EMI filter having the signal line which does not contain the ferrite powder. Therefore, even though the high frequency noise is mixed into the signal line, the noise can be attenuated efficiently. Furthermore, in this embodiment, since the conductivity $\sigma2$ of the signal line 21 is retained at the approximately same value as the conductivity $\sigma1$ of the signal line which does not contain the ferrite powder as described above, the low frequency signal which needed essentially can pass through efficiently.

Moreover, according to this mode of embodiment, in order to make the skin depth $\delta$ small, the paste containing silver and ferrite is used as the conductive paste. However, the paste may be the combinations (for example, copper and permalloy, silver and permalloy or the like) except for the combination of silver and ferrite, if it can be make the value of $\sigma\mu$ shown in the expression (1) representing the skin depth $\delta$ large.

Moreover, in this mode of embodiment, the signal line is constituted by using the conductive member according to the invention. However, the conductive members (for example, an electrode constituting a capacitor) except for the signal line may be constituted by using the conductive member according to the invention.

Moreover, in this mode of embodiment, the signal line of EMI filter is constituted by using the conductive member according to the invention. However, the conductive members such as the signal line which is provided on electronic components except for EMI filter may be constituted by using the conductive member according to the invention, and such a use of the present invention can attenuate the high frequency noise efficiently. Moreover, for example, a wiring which formed on a circuit substrate may be constituted by using the conductive member according to the invention, whereby the high frequency noise can be attenuated efficiently, even though the high frequency noise is mixed into the wiring of the circuit substrate.

According to the present invention, the noise having frequency components, for example, of the order of several GHz can be attenuated efficiently.

What is claimed is:

1. A conductive member comprising a first material and a second material, characterized in that the product of conductivity and permeability of the conductive member is larger than the product of conductivity and permeability of a conductive member having only one of the first and second materials.

2. A conductive member as claimed in claim 1, characterized in that the first material is a metal material and the second material is a magnetic material, and the product of conductivity and permeability of a conductive member having the metal material and the magnetic material is larger than the product of conductivity and permeability of a conductive member not having the magnetic material but having the metal material.

3. A conductive member as claimed in claim 2, characterized in that the magnetic material is a ferromagnetic material.

4. An electronic component comprising the conductive member as claimed in claim 1.

5. An electronic component as claimed in claim 4, characterized in that the electronic component is an EMI filter.

6. A printed circuit board comprising a substrate and a conductive member according to claim 1.

7. Electronic device operative to generate electronic signals with a high frequency content comprising a conductive member according to claim 1.

8. Electronic device operative to generate electronic signals with a high frequency content comprising an electronic component according to claim 4.

* * * * *